June 2, 1970 R. F. BROWN, JR 3,516,005
AMPLIIFIER FOR ENHANCING DIFFERENTIAL INPUT SIGNALS
Filed May 6, 1968
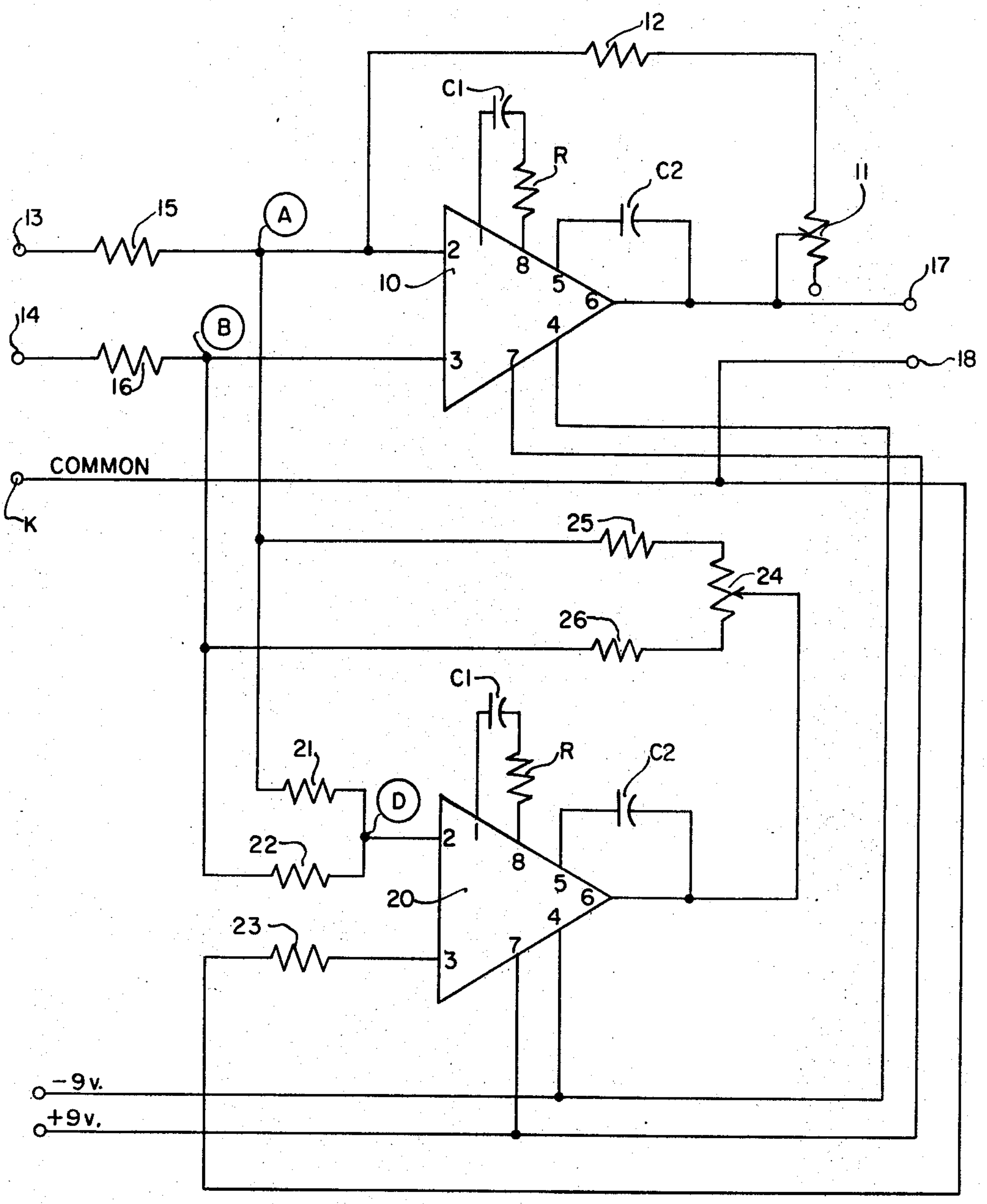
INVENTOR
ROBERT F. BROWN jr.
BY Alexander & Dowell
ATTORNEYS United States Patent Office 3,516,005
Patented June 2, 1970

3,516,005

AMPLIFIER FOR ENHANCING DIFFERENTIAL INPUT SIGNALS

Robert F. Brown, Jr., Dallas, Tex., assignor to Teledyne Industries—Geotech Division, a corporation of Texas Filed May 6, 1968, Ser. No. 726,715
Int. Cl. H03f 3/68
U.S. Cl. 330—69 5 Claims

ABSTRACT OF THE DISCLOSURE

An amplifier system for enhancing desired differential input signals to be amplified, while repressing undesired common-mode input signals, by cancelling out the latter mode of signals at the inputs of the main differential amplifier using an inverse cancellation signal inverted in an auxiliary amplifier path and fed back to the inputs of the main differential amplifier, the auxiliary amplifier not passing signal components applied to the over-all amplifier system in push-pull.

This invention relates to improvements in differential input amplifier systems, and particularly to improved circuitry for the rejection of common-mode signals appearing on both input terminals, without rejection of differential mode signals applied thereto.

In practical systems for amplifying low amplitude signals, for instance differential (push-pull) signals from transducers applied to the human body and connected by ungrounded wires in a cable to amplifying and recording apparatus, the cable also acts as a pick-up for spurious signals such as 60 Hz. hum whose components are of about the same amplitude and phase in both wires leading from the transducer. Thus, these ungrounded input wires include desired differential signal components which are mutually 180° out of phase, and further include undesired signal potentials with respect to ground which in the wires of the cable are mutually in phase.

There are many operational amplifier circuits available which have true differential input characteristics providing high common mode rejection, but when an ordinary negative feedback loop is applied from the single-ended output terminal to one of the input terminals for the purpose of controlling the overall gain and linearity, the amplier circuit then becomes unbalanced so that the gain at one input terminal no longer equals the gain at the other input terminal, and therefore the common mode rejection capability of the differential amplifier is reduced. The greater the percentage feedback applied the greater the percentage unbalance, with the result that the differential amplifier can no longer introduce the common mode rejection which is needed.

It is therefore a major object of this invention to provide auxiliary circuitry connected to the input terminals of the differential operational amplifier and operative to cancel out components of the input signals applied thereto when these components are applied in common phase to both terminals, without reducing the capability of the circuit to amplify desired differential input signals.

Another object of the invention is to provide circuitry which lends itself well to integrated amplifier modules so that two integrated circuit modules can by external mutual-interconnection perform the desired common mode rejection while at the same time delivering a single-ended output whose amplitude is proportional to the magnitude of the input differential-signal component.

A further object of the invention is to provide common-mode cancellation circuitry employing non-precision parts and having convenient means for adjusting the cancellation of signals appearing in common at both input terminals of the differential amplifier.

Other objects and advantages of the invention will become apparent during the following discussion of the drawing which shows a schematic diagram of common-mode rejection amplifier means illustrative of the present invention.

Referring now to the drawing, the illustrative circuit includes two operational amplifier chips 10 and 20 which in the working embodiment of the present invention are substantially identical integrated circuits purchased on the open market from the manufacturer shown in the table at the end of the specification. These chips are push-pull high-gain operational amplifiers having differential-input terminals 2 and 3, terminal 2 in each amplifier providing an inverted signal at the related output terminal 6. The values of the capacitors C1 and C2 and the values of the resistors R are suggested by the manufacturer of the integrated circuits 10 and 20 to stabilize their performance in a manner well known in the integrated circuitry art, these parts being connected between the terminals 1, 8, 5 and 6 of both amplifiers as shown in the drawing. The terminals 7 and 4 are connected to minus 9 volts and plus 9 volts, respectively as measured to a common terminal K of the power supply.

The upper amplifier 10 comprises the main differential amplifier which is provided with a negative feedback loop including the resistors 11 and 12, the former being adjustable to set the over-all gain of the differential amplifier 10 to a desired value and to provide the desired degree of linearity. The main input to the amplifier is applied to terminals 13 and 14 through series resistances 15 and 16, and to the differential input terminals 2 and 3 of the amplifier chip 10. The main output of the system is single-ended with respect to the common terminal K, and this output appears across terminals 17 and 18.

As stated above, the obejct of the invention is to cancel out at points A and B any common-mode signal component appearing mutually in-phase thereat. For this purpose all of the signal components appearing at these two points are coupled by resistances 21 and 22 to a common point D which is connected to the inverting input terminal 2 of the auxiliary amplifier 20. The other non-inverting terminal 3 is returned to the common terminal K through a resistance 23.

In view of the fact that the resistors 15–16 and 21–22 are all of substantially equal value, if a common mode signal is applied at input terminals 13–14, the change in signal level at both terminals A and B will be equal, and furthermore the change in potential at terminal D will be the same as that at terminals A and B. Thus, any common mode component will be applied from point D to the inverting input terminal 2 of the auxiliary amplifier chip 20. Since this is a high-gain inverting amplifier path, an amplified cancellation signal based upon the signal at D will be applied through the potentiometer 24 and the resistors 25 and 26 back to the points A and B. The gain of the amplifier 20 is selected to just cancel out any common mode signal at A and B which would change the signal level at point D, and thereby prevent it from being applied to the differential input terminals of the main amplifier chip 10. The potentiometer 24 can be adjusted to balance this cancellation and to take into account any error which might otherwise be introduced by differences in the values of the resistors 15, 16, 21, 22, 25 and 26 due to production tolerances.

Conversely, if a purely differential signal is applied at terminals 13 and 14 so that the changes in signal levels at points A and B are differential, meaning 180° out of phase, these differential excursions will be applied to the point D through resistors 21 and 22, so that if the voltage rises through resistor 21 and decreases an equal amount through the resistor 22 for instance, it remains constant at the point D, and no input is therefore applied to the auxiliary amplifier chip 20. Therefore, no change in output appears at terminal 6 of amplifier 20 and no correction is made in the voltages appearing at terminals A and B at the input to the main signal amplifier 10.

Thus, it can be seen that the present amplifier circuitry cancels at the virtual input terminals of the main signal amplifier 10 only those components which appear thereat in common-mode, while making no change in signals appearing in push-pull mode. In practice, in connection for example with biological transducer recording systems where the desired differential signal is of the order of a tenth of a volt, but the 60 Hz. common mode signal picked up by the cable may be of the order of one volt or more, the present amplifier circuit can be used to suppress the larger common-mode component to an extent that makes it very small as compared with the desired differential mode signal appearing at the same terminals, and the output signal is therefore greatly enhanced for desired signals which can then be conveniently recorded for further study by connecting a suitable recorder to the output terminal 17 of the system.

A table of circuit components which operate to provide excellent small-amplitude signal handling capability in the modes described above is as follows:

Operational amplifiers 10 and 20—Fairchild 709C
Capacitors C1—1000 pfd.
Capacitors C2—100 pfd.
Resistors R—1500 kilohms
Potentiometer 11—100 kilohms
Resistor 12—4.7 kilohms
Resistors 15, 16, 21, 22 and 23—10 kilohms
Potentiometer 24—500 ohms
Resistors 25, 26—3.3 kilohms

Having thus described a working embodiment of my invention, I now set forth the following claims:

1. An amplifier system for amplifying desired components of input signals applied to its terminals in differential modes, while rejecting undesired signal components appearing at said terminals in common mode, comprising:

(a) main amplifier means having differential inputs connected to said system terminals and operative to amplify the signals appearing thereat to deliver an output signal representative of the components at its inputs;

(b) an auxiliary amplifying path including auxiliary amplifier means having an input;

(c) coupling means in said auxiliary path for connecting the input of said auxiliary amplifier means to points at both of said differential inputs to receive said common-mode signal components while cancelling out said differential-mode signal components;

(d) balanced output impedance means for coupling the output of the auxiliary amplifier means to the same respective points of the inputs of the main amplifier means to deliver to the latter cancellation signals representative of said common mode signal components but inverted with respect thereto; and (e) means to determine the over-all gain of said auxiliary amplifying path to make said cancellation signals substantially cancel the common mode signal components at the inputs of the main amplifier means.

2. In an amplifier system as set forth in claim 1, separate similar impedance means respectively coupling said system terminals with said main amplifier means inputs, and said coupling means comprising other mutually similar impedances respectively connected between the latter inputs and the single input of the auxiliary amplifier means.

3. In an amplifier system as set forth in claim 2, said similar impedances and said balanced output impedance means being respectively connected together and to the main amplifier means inputs, and forming a composite inverse feedback path extending from the output of the auxiliary amplifier means to its input and comprising said means to determine the over-all gain of the path.

4. In an amplifier system as set forth in claim 1, potentiometer means having end terminals respectively connected to said balanced output impedance means and having a wiper terminal connected to the output of said auxiliary amplifier means, and the potentiometer being adjustable to proportion the cancellation signals applied to the inputs of the main amplifier means to obtain maximum common signal rejection.

5. In an amplifier system as set forth in claim 1, said main amplifier means comprising a push-pull amplifier having a single-ended output comprising the output of the system and inverted with respect to one of its inputs, and inverse feedback means connected between said single-ended output and said one input.

References Cited

UNITED STATES PATENTS

| | | | |
|---|---|---|---|
| 2,977,547 | 3/1961 | Talambiras | 330—69 |
| 3,189,840 | 6/1965 | Braymer et al. | 330—69 X |
| 3,316,495 | 4/1967 | Sherer | 330—30 |

ROY LAKE, Primary Examiner

J. B. MULLINS, Assistant Examiner

U.S. Cl. X.R.

330—30